United States Patent
Ishikawa et al.

(10) Patent No.: US 6,911,728 B2
(45) Date of Patent: Jun. 28, 2005

(54) MEMBER FOR ELECTRONIC CIRCUIT, METHOD FOR MANUFACTURING THE MEMBER, AND ELECTRONIC PART

(75) Inventors: Shuhei Ishikawa, Handa (JP); Takahiro Ishikawa, Nagoya (JP); Masahiro Kida, Ama-Gun (JP); Ken Suzuki, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/258,231

(22) PCT Filed: Dec. 19, 2001

(86) PCT No.: PCT/JP01/11134

§ 371 (c)(1),
(2), (4) Date: Oct. 21, 2002

(87) PCT Pub. No.: WO02/067324

PCT Pub. Date: Aug. 29, 2002

(65) Prior Publication Data
US 2003/0102553 A1 Jun. 5, 2003

(30) Foreign Application Priority Data
Feb. 22, 2001 (JP) ................................. 2001-047052

(51) Int. Cl.[7] ........................... H01L 23/10; H01L 23/34
(52) U.S. Cl. .................................................. 257/706
(58) Field of Search .............................. 257/701, 703, 257/705–707, 712, 713, 717; 438/119, 122, 118, 125; 174/252, 259; 361/676, 709

(56) References Cited

U.S. PATENT DOCUMENTS

| 5,130,498 A | * 7/1992 | Yoshida et al. ............. 174/252 |
| 5,354,415 A | * 10/1994 | Fushii et al. ................. 156/630 |
| 6,309,737 B1 | * 10/2001 | Hirashima et al. ........... 428/210 |
| 6,485,816 B2 | * 11/2002 | Araki et al. .................. 428/210 |
| 2002/0089828 A1 | * 7/2002 | Suzuki et al. |
| 2002/0109152 A1 | * 8/2002 | Kobayashi et al. |
| 2002/0175403 A1 | * 11/2002 | Sreeram et al. |

FOREIGN PATENT DOCUMENTS

| EP | 1 000 915 A2 | 5/2000 |
| JP | 59-228742 | 12/1984 |
| JP | 3-242385 | 10/1991 |
| JP | 8-279569 | 10/1996 |
| JP | 11-274383 | 10/1999 |
| JP | 11-307696 | 11/1999 |
| JP | 2000-164775 | 6/2000 |
| JP | 2000-174183 | 6/2000 |
| JP | 2000-281468 | 10/2000 |

* cited by examiner

Primary Examiner—David A. Zarneke
(74) Attorney, Agent, or Firm—Burr & Brown

(57) ABSTRACT

A member for use in an electronic circuit has a thermally conductive layer mounted on a heat sink. The thermally conductive layer comprises an insulating substrate, a first joint member joining the insulating substrate to the heat sink and containing an active element, a second joint member disposed on the insulating substrate, and an electrode disposed on the second joint member. The insulating substrate comprises an AlN layer or an $Si_3N_4$ layer. Each of the first and second joint members is made of a hard brazing material containing an active element. The heat sink is made of an SiC/Cu composite material or a C/Cu composite material.

23 Claims, 16 Drawing Sheets

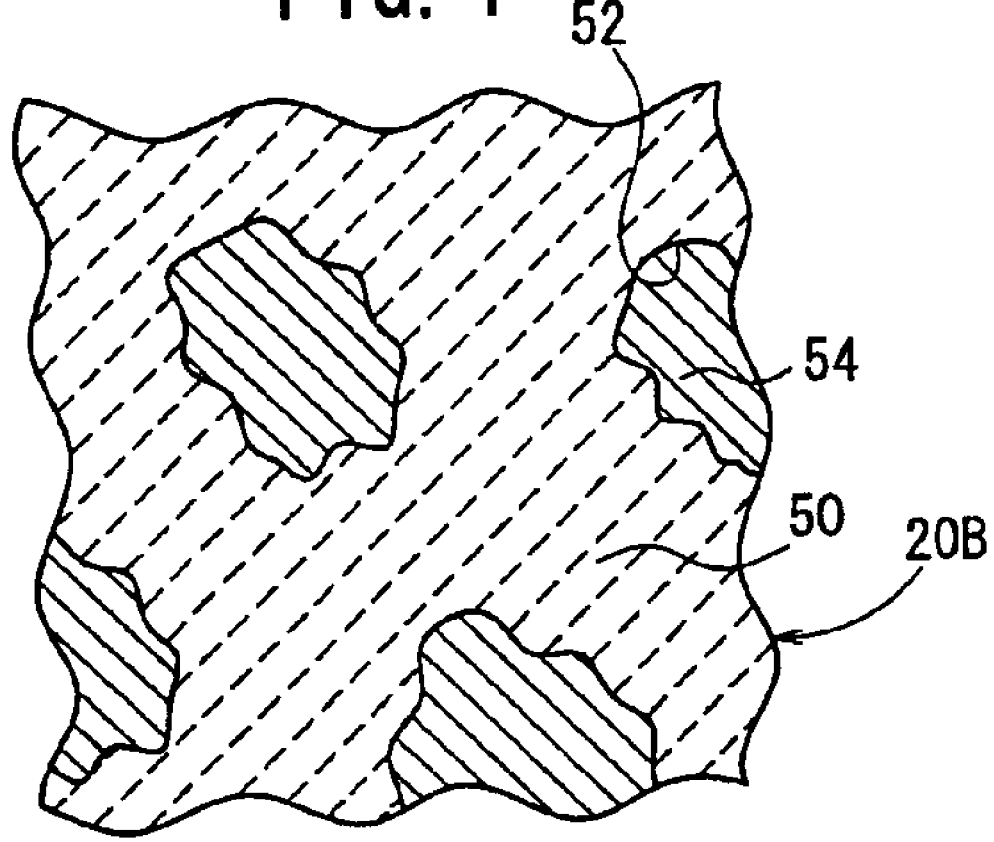

FIG. 5A
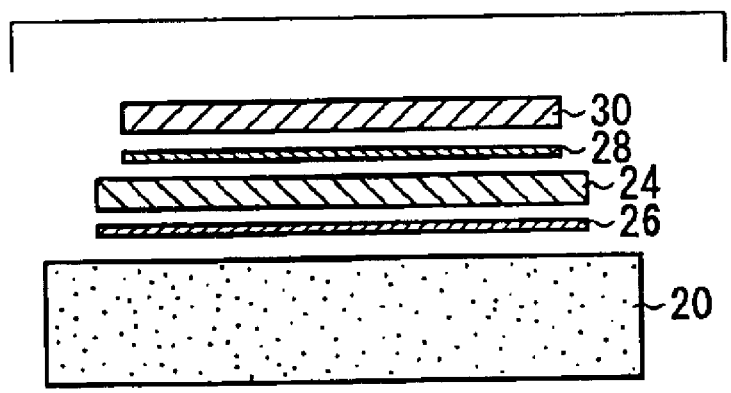
FIG. 5B
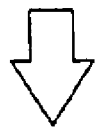
PRESSURE
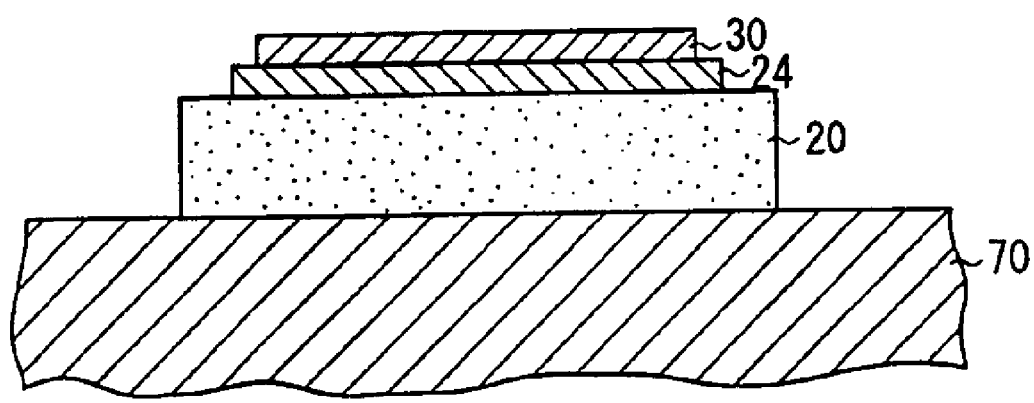

FIG. 6

| | HEAT SINK | HEAT SINK/INSULATING SUBSTRATE INTERFACE | INSULATING SUBSTRATE | INSULATING SUBSTRATE/ELECTRODE INTERFACE | ELECTRODE |
|---|---|---|---|---|---|
| INVENTIVE EXAMPLE 1 | C/Cu COMPOSITE MATERIAL | Ag-Cu-Ti BRAZING LAYER | AlN | Ag-Cu-Ti BASED LAYER | Cu |
| INVENTIVE EXAMPLE 2 | C/Cu COMPOSITE MATERIAL | Ag-Cu-In-Ti BRAZING LAYER | AlN | Ag-Cu-In-Ti BRAZING LAYER | Cu |
| INVENTIVE EXAMPLE 3 | SiC/Cu COMPOSITE MATERIAL | Ag-Cu-Ti BRAZING LAYER | AlN | Ag-Cu-Ti BASED LAYER | Cu |
| INVENTIVE EXAMPLE 4 | SiC/Cu COMPOSITE MATERIAL | Ag-Cu-In-Ti BRAZING LAYER | AlN | Ag-Cu-In-Ti BASED LAYER | Cu |
| INVENTIVE EXAMPLE 5 | C/Cu COMPOSITE MATERIAL | Ag-Cu-Ti BRAZING LAYER | $Si_3N_4$ | Ag-Cu-Ti BASED LAYER | Cu |
| INVENTIVE EXAMPLE 6 | C/Cu COMPOSITE MATERIAL | Ag-Cu-In-Ti BRAZING LAYER | $Si_3N_4$ | Ag-Cu-In-Ti BASED LAYER | Cu |
| INVENTIVE EXAMPLE 7 | SiC/Cu COMPOSITE MATERIAL | Ag-Cu-In-Ti BRAZING LAYER | $Si_3N_4$ | Ag-Cu-In-Ti BASED LAYER | Cu |
| INVENTIVE EXAMPLE 8 | SiC/Cu COMPOSITE MATERIAL | Ag-Cu-In-Ti BRAZING LAYER | $Si_3N_4$ | Ag-Cu-In-Ti BASED LAYER | Cu |
| COMPARATIVE EXAMPLE 1 | Cu | SOLDER/Ni PLATED LAYER /Cu/Ag-Cu-Ti BRAZING LAYER | AlN | Ag-Cu-Ti BASED LAYER | Cu |
| COMPARATIVE EXAMPLE 2 | Cu | Ag-Cu-In-Ti BRAZING LAYER | AlN | Ag-Cu-In-Ti BASED LAYER | Cu |

FIG. 7

| | THERMAL RESISTANCE (STANDARDIZED VALUE) |
|---|---|
| INVENTIVE EXAMPLE 1 | 0.75 |
| INVENTIVE EXAMPLE 2 | 0.75 |
| INVENTIVE EXAMPLE 3 | 0.95 |
| INVENTIVE EXAMPLE 4 | 0.94 |
| INVENTIVE EXAMPLE 5 | 0.81 |
| INVENTIVE EXAMPLE 6 | 0.80 |
| INVENTIVE EXAMPLE 7 | 1.02 |
| INVENTIVE EXAMPLE 8 | 1.03 |
| COMPARATIVE EXAMPLE 1 | 1.00 |
| COMPARATIVE EXAMPLE 2 | 0.67 |

FIG. 8

| | HEAT SINK COEFFICIENT OF THERMAL EXPANSION (ppm/K) | WARPING DIRECTION | AMOUNT OF WARPAGE (mm) |
|---|---|---|---|
| INVENTIVE EXAMPLE 11 | 4.5 | UPPER DIRECTION | 0.06 |
| INVENTIVE EXAMPLE 12 | 6.2 | UPPER DIRECTION | 0.04 |
| INVENTIVE EXAMPLE 13 | 8.4 | UPPER DIRECTION | 0.02 |
| COMPARATIVE EXAMPLE 1 | 17 | – | – |
| COMPARATIVE EXAMPLE 2 | 17 | LOWER DIRECTION | 0.08 |

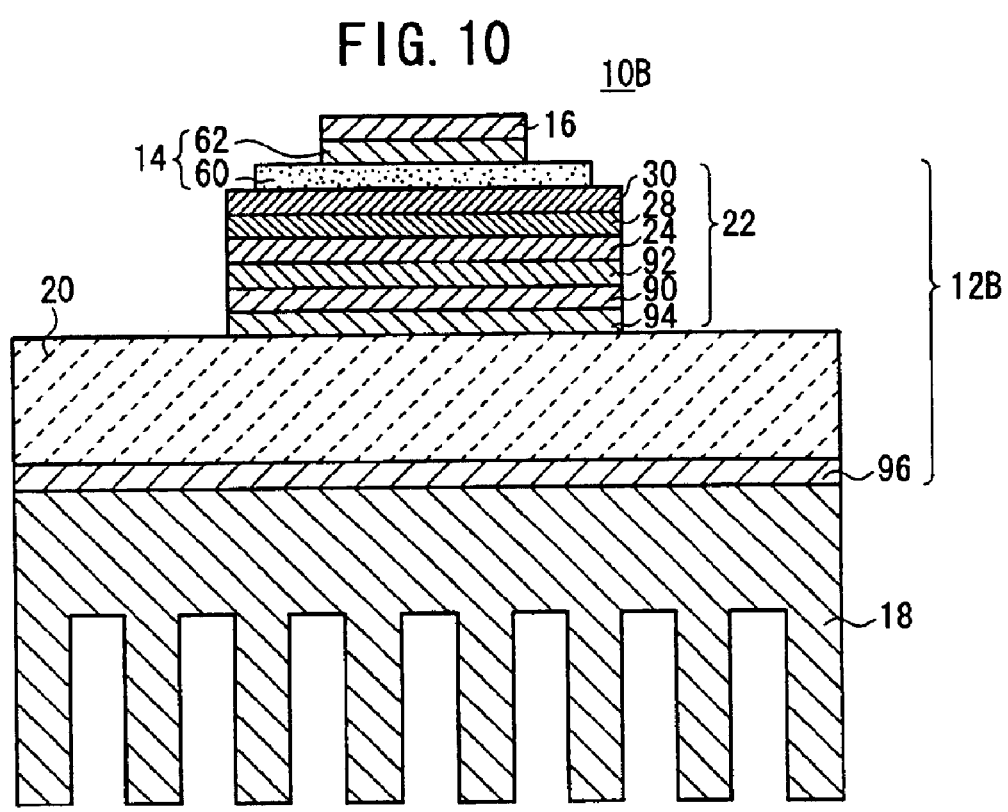

PRESSURE

FIG. 12

| INVENTIVE EXAMPLE | | 21 | 22 | 23 | 24 | 25 |
|---|---|---|---|---|---|---|
| UPPER ELECTRODE | MATERIAL | Cu | Cu | Cu | Cu | Cu |
| | COEFFICIENT OF THERMAL CONDUCTIVITY (W/mK) | 390 | 390 | 390 | 390 | 390 |
| | THICKNESS (mm) | 0.3 | 0.3 | 0.3 | 0.3 | 0.3 |
| INSULATING SUBSTRATE | MATERIAL | AlN | SN | SN | SN | SN |
| | COEFFICIENT OF THERMAL CONDUCTIVITY (W/mK) | 180 | 30 | 40 | 60 | 90 |
| | THICKNESS (mm) | 0.635 | 0.3 | 0.3 | 0.3 | 0.3 |
| INTERMEDIATE LAYER | MATERIAL | Cu | Cu | Cu | Cu | Cu |
| | COEFFICIENT OF THERMAL CONDUCTIVITY (W/mK) | 390 | 390 | 390 | 390 | 390 |
| | THICKNESS (mm) | 0.3 | 0.3 | 0.3 | 0.3 | 0.3 |
| HEAT SINK | MATERIAL | C/Cu | C/Cu | C/Cu | C/Cu | C/Cu |
| | COEFFICIENT OF THERMAL CONDUCTIVITY (W/mK) | 330 | 330 | 330 | 330 | 330 |
| | THICKNESS (mm) | 3.000 | 3.000 | 3.000 | 3.000 | 3.000 |
| JOINED ASSEMBLY | THICKNESS (mm) | 4.235 | 3.900 | 3.900 | 3.900 | 3.900 |
| | THEORETICAL COEFFICIENT OF THERMAL CONDUCTIVITY (W/mK) | 299.1 | 189.1 | 215.1 | 249.1 | 279.3 |
| MEASURED VALUE (W/mK) | | 284.1851 | 179.5983 | 204.3645 | 237.0537 | 265.3497 |

FIG. 14

| INVENTIVE EXAMPLE | ELECTRODE [COPPER] (mm) | INSULATING SUBSTRATE (mm) | INTERMEDIATE LAYER (mm) | HEAT SINK (mm) | METAL LAYER (mm) | WARPING DIRECTION | AMOUNT OF WARPAGE (μm) | JOINING PRESSURE (MPa) |
|---|---|---|---|---|---|---|---|---|
| 31 | 0.3 | AlN 0.635 | 0.3 | C/Cu 3 | 0.1 | LOWER DIRECTION | 75 | 2.5 |
| 32 | 0.3 | AlN 0.635 | 0.3 | C/Cu 3 | 0.1 | LOWER DIRECTION | 125 | 7.5 |
| 33 | 0.3 | AlN 0.635 | - | C/Cu 3 | - | LOWER DIRECTION | 375 | 2.5 |
| 34 | 0.3 | AlN 0.635 | - | C/Cu 3 | - | LOWER DIRECTION | 175 | 7.5 |
| 35 | 0.3 | Si₃N₄ 0.3 | 0.3 | C/Cu 3 | - | UPPER DIRECTION | 125 | 2.5 |
| 36 | 0.3 | Si₃N₄ 0.3 | 0.1 | C/Cu 3 | - | UPPER DIRECTION | 80 | 2.5 |
| 37 | 0.3 | Si₃N₄ 0.3 | - | C/Cu 3 | - | UPPER DIRECTION | 525 | 2.5 |
| 38 | 0.3 | Si₃N₄ 0.3 | - | C/Cu 3 | 0.1 | UPPER DIRECTION | 375 | 7.5 |
| 39 | 0.3 | Si₃N₄ 0.3 | 0.1 | C/Cu 3 | - | UPPER DIRECTION | 175 | 7.5 |
| 40 | 0.3 | Si₃N₄ 0.3 | 0.2 | C/Cu 3 | - | UPPER DIRECTION | 225 | 7.5 |
| 41 | 0.3 | Si₃N₄ 0.3 | 0.25 | C/Cu 3 | - | UPPER DIRECTION | 235 | 7.5 |
| 42 | 0.3 | Si₃N₄ 0.3 | 0.3 | C/Cu 3 | - | UPPER DIRECTION | 235 | 7.5 |

MEMBER FOR ELECTRONIC CIRCUIT, METHOD FOR MANUFACTURING THE MEMBER, AND ELECTRONIC PART

TECHNICAL FIELD

The present invention relates to a member for use in an electronic circuit for cooling an electronic circuit chip composed of semiconductors, etc., a method of manufacturing such a member, and an electronic component.

BACKGROUND ART

Generally, semiconductor devices are highly susceptible to heat, and should be designed such that their internal temperature will not exceed an allowable maximum temperature at a junction area of said semiconductor devices. Semiconductor devices such as power transistors and semiconductor rectifiers consume a large amount of electric energy per operating area, and cases (packages) and leads of such semiconductor devices may not be effective enough to sufficiently radiate heat generated thereby. Therefore, the internal temperature of those semiconductor devices tend to increase to such a level that the semiconductor devices may suffer a thermal breakdown.

The above phenomenon also occurs in semiconductor devices incorporating CPUs. As the clock frequency of the CPU increases, the semiconductor device generates more heat while in operation. It is important to design semiconductor devices to incorporate a thermally designed heat radiation structure.

Thermal designs for protecting semiconductor devices against a thermal breakdown include device designs and mount designs which include heat sinks having a large heat radiating area and fixed to semiconductor device cases (packages).

The heat sinks are generally made of metal such as copper, aluminum, or the like that has good thermal conductivity.

Recently, semiconductor devices such as CPUs, memories, etc. tend to be larger in size because of higher integration of semiconductors and greater areas taken up by semiconductors, while at the same time seeking a low power drive mode for low power consumption. Semiconductor devices of greater size are liable to peel off position or be mechanically broken due to increased stresses which are caused by the difference between the coefficient of thermal expansion of the semiconductor substrate (including a semiconductor device of silicon or GaAs and an insulating substrate of AlN or $Si_3N_4$) and the coefficient of thermal expansion of the heat sink.

Possible approaches to the prevention of the above drawbacks include a low power drive mode for semiconductor devices and an improvement of heat sink materials. At present, a practical low power drive mode for semiconductor devices has a power supply voltage of 3.3 V or lower rather than the conventional TTL level (5 V).

As for heat sink materials, thermal conductivity is not the only factor to be taken into consideration for their selection, but it has become necessary to select heat sink materials which have a coefficient of thermal expansion that is substantially the same as the coefficient of thermal expansion of silicon and GaAs which the semiconductor substrate is made of, and also have high thermal conductivity.

Various reports have been made with respect to improved heat sink materials. For example, proposed examples of heat sink materials include aluminum nitride (AlN) and Cu (copper)—W (tungsten). Cu—W is a composite material having a low coefficient of thermal expansion provided by W and a high coefficient of thermal conductivity provided by Cu.

Other examples of heat sink materials include a ceramic base material mainly composed of SiC and containing 20 vol. % to 40 vol. % of Cu (conventional example 1: Japanese laid-open patent publication No. 8-279569) and a powder-sintered porous body of an inorganic material infiltrated with 5 wt. % to 30 wt. % of Cu (conventional example 2: Japanese laid-open patent publication No. 59-228742). However, these heat sink materials hardly satisfy market demands as their characteristics, machinability, and prices are not well balanced.

A conventional electronic component 100 which incorporates a thermal countermeasure therein will be described below with reference to FIG. 15. The electronic component 100 includes an IC chip 108 mounted on a heat sink 102 with a thermally conductive layer 104 and a base layer 106 interposed therebetween. The thermally conductive layer 104 has a laminated assembly 118 mounted on and joined to an Ni plated layer 110 formed by covering the heat sink 102 over. The laminated assembly 118 comprises a lower electrode layer 112 of Cu or Al, an insulating layer (AlN layer) 114, and an upper electrode layer 116 of Cu or Al. The Ni plated layer 110 and the laminated assembly 118 are joined to each other by a solder layer 120. An Ni layer 122 is interposed between the laminated assembly 118 and the solder layer 120 to increase the wettability of the lower electrode layer 112 with respect to the solder layer 120.

The IC chip 108 is mounted on the laminated assembly 118 with a solder layer 124 interposed therebetween. An Ni layer 126 is interposed between the laminated assembly 118 and the solder layer 124 to increase the wettability of the upper electrode layer 116 with respect to the solder layer 124. Similarly, an Ni layer 128 is interposed between the IC chip 108 and the solder layer 124 to increase the wettability of the IC chip 108 with respect to the solder layer 124.

As shown in FIG. 16, another conventional electronic component 200 (see Japanese laid-open patent publication No. 11-307696, for example) has a metal base plate 202 for radiating heat generated by a semiconductor chip 204, a ceramic plate 206 which insulates the semiconductor chip 204 from the metal base plate 202, an upper electrode 210 disposed on an upper surface of the ceramic plate 206 with a brazing layer 208 interposed therebetween, a lower electrode 214 disposed underneath a lower surface of the ceramic plate 206 with a brazing layer 212 interposed therebetween, a metal spacer 216 which spaces the metal base plate 202 and the ceramic plate 206 from each other, a brazing layer 218 which is fixed the metal spacer 216 to the metal base plate 202, a solder layer 220 which is fixed the semiconductor chip 204 to the upper electrode 210, and a solder layer 222 which is fixed the lower electrode 214 to the metal spacer 216.

The electronic component 100 shown in FIG. 15 is manufactured by a process comprising at least eight steps, i.e., the first step of forming the Ni plated layer 110 on the heat sink 102, the second step of forming the Ni layer 128 on the lower surface of the IC chip 108, the third and fourth steps of forming the upper electrode layer 116 and the lower electrode layer 112, each made of Cu or Al, respectively on the opposite surfaces of the insulating layer 114, producing the laminated assembly 118, the fifth and sixth steps of forming the Ni layers 126, 112 respectively on the upper surface of the upper electrode layer 116 and the lower surface of the lower electrode layer 112, the seventh step of joining the laminated assembly 118 to the Ni plated layer 110 on the heat sink 102 with the solder layer 120, and the eighth step of joining the Ni plated layer 128 formed on the lower surface of the IC chip 108 to the laminated assembly 118 with the solder layer 124. The manufacturing process is complex, and leads to an increase in the cost of the final product, i.e., the electronic component 100.

Furthermore, since there are many elements to be laminated to complete the electronic component 100, an attempt may be proposed to reduce the thickness of the solder layer 120 to several hundreds μm, for example, in order to reduce the size of the electronic component 100. However, since the solder layer 120 itself is poor in its heat radiation capability and the electronic component 100 contains many junction interfaces between different materials which tend to impair the heat radiation capability of the electronic component 100, the heat from the IC chip 108 cannot efficiently be transferred to the heat sink 102.

The junction provided by the solder layer 120 is liable to make the electronic component 100 less durable when the electronic component 100 is subjected to heat cycles or heat shocks. Specifically, when the electronic component 100 is subjected to heat cycles or heat shocks, (1) the insulating layer is warped, (2) the electrodes are peeled off, (3) the insulating layer cracks, and (4) the soldered areas suffer cracking, resulting in an operation failure of semiconductor devices contained in the electronic components. The above problems also occur with the electronic component 200 shown in FIG. 16.

The present invention has been made in view of the above problems. It is an object of the present invention to provide a member for use in an electronic circuit which can be manufactured by a process having a greatly reduced number of steps, has its manufacturing cost effectively reduced, and is highly thermally reliable, a method of manufacturing such a member, and an electronic component.

DISCLOSURE OF INVENTION

A member for use in an electronic circuit according to the present invention is characterized in that a joint member containing an active element is interposed between a layer functioning as an insulating substrate (hereinafter conveniently referred to as "insulating substrate") and a heat sink.

The active element contained in the joint member firmly joins the insulating substrate and the joint member to each other, and also firmly joins the heat sink and the joint member, resulting in a firm joint between the insulating substrate and the heat sink.

A member for use in an electronic circuit according to the present invention is also characterized in that an intermediate layer is interposed between a layer functioning as an insulating substrate and a heat sink, and joint members each containing an active element are interposed respectively between the layer functioning as the insulating substrate and the intermediate layer and between the intermediate layer and the heat sink.

The active metal contained in the joint members firmly joins the insulating substrate and the intermediate layer to each other and also firmly joins the intermediate member and the heat sink, resulting in a firm joint between the insulating substrate and the heat sink.

The presence of the intermediate layer is possible to lessen the difference between a coefficient of thermal expansion of the insulating substrate and a coefficient of thermal expansion of the heat sink when the assembly is thermally shocked, and improve the bonding strength of the member. Thus, the intermediate layer is effective to increase the thermal shock resistance of the member.

The layer functioning as the insulating substrate, the joint members, and the heat sink should preferably have a coefficient of thermal expansion ranging from $3.0 \times 10^{-6}$ to $1.0 \times 10^{-5}$/K. The intermediate layer should preferably have a coefficient of thermal expansion ranging from $3.0 \times 10^{-6}$ to $1.0 \times 10^{-5}$/K in order to lessen stresses produced when the assembly is thermally shocked, and should preferably be made of a material having a low Young's modulus and a low strength so that stresses produced by thermal expansion are small. The intermediate layer may be made of aluminum, silver, copper, or an alloy thereof.

When an IC chip, for example, is mounted on the member, producing an electronic component, and the temperature of the electronic component rises due to its usage, the heat sink and the insulating substrate do not peel off each other.

The joint members should preferably be made of a hard brazing material containing an active element. In this case, the joint members after being joined have an average thickness of 50 μm or lower, preferably 10 μm or lower, or more preferably 5 μm or lower. This thickness can be controlled by the applied pressure.

Since the joint members have a more excellent heat radiation capability than if they comprise a solder layer. The heat from the IC chip can efficiently be transferred to the heat sink, so that the electronic component can easily be designed thermally. Even when the electronic component is subjected to heat cycles and heat shocks, the insulating substrate is less liable to cracking, and hence the thermally reliability of the electronic component is increased.

Specifically, if soldering is used, when the electronic component is subjected to heat cycles or heat shocks, (1) the insulating substrate is warped, (2) the electrodes are peeled off, (3) the insulating substrate cracks, and (4) the soldered areas suffer cracking, resulting in an operation failure of the semiconductor device in the electronic component. According to the present invention, the member and the electronic component are free of the above problems and are highly reliable.

The active element may comprise at least one element belonging to the 2A group, 3A group, 4A group, 5A group, or 4B group in the periodic table.

The heat sink may be made of a material comprising at least one selected from the group consisting of SiC, AlN, $Si_3N_4$, BeO, $Al_2O_3$, $Be_2C$, C, Cu, Cu alloy, Al, Al alloy, Ag, Ag alloy, and Si.

Particularly, if the heat sink is made of a composite material having an SiC matrix or a C (Carbon) matrix infiltrated with Cu or Cu alloy, then the heat sink has a low coefficient of thermal expansion and a high coefficient of thermal conductivity, and its coefficient of thermal expansion substantially matches the coefficient of thermal expansion of the insulating substrate, with any mismatch greatly reduced. Thus, any residual stresses produced in the insulating substrate when the heat sink is joined thereto are suppressed, so that the heat sink can be joined to the insulating substrate over a large area thereof.

The insulating substrate may comprise an AlN layer or an $Si_3N_4$ layer. The insulating substrate thus has substantially the same coefficient of thermal expansion as the IC chip, and has a high coefficient of thermal conductivity.

The heat sink should preferably have a outwardly convex surface on which cooling fins are mounted. However, because grease is used between the heat sink and the cooling fins, the heat sink may be used even if it has a nearly flat shape.

If the heat sink has a outwardly convex surface on which cooling fins are mounted, then the outwardly convex surface should preferably project by a dimension which is in a range from 1/200 to 1/20000 of the maximum length of the heat sink. Therefore, when the cooling fins are fastened to the heat sink by screws or the like, the heat sink and the cooling fins can easily be secured to each other, and the close contact between the heat sink and the cooling fins can be enhanced for greater heat radiation.

A method of manufacturing a member for use in an electronic circuit according to the present invention is characterized in that a heat sink, a layer functioning as an insulating substrate, and an electrode are simultaneously joined. Therefore, the number of manufacturing steps of the method is greatly reduced, and hence the manufacturing cost is effectively lowered. In addition, the member for use in an electronic circuit is highly thermally reliable.

The method may include the step of joining a layer functioning as an insulating substrate to a heat sink through a joint member containing an active element, or the steps of interposing a first joint member containing an active element between the layer functioning as the insulating substrate and an intermediate layer, interposing a second joint member containing an active element between the intermediate layer and the heat sink, and joining the layers and the members.

The layers and the members may be joined under pressure. Preferably, the pressure should range from 0.2 MPa to 10 MPa for firmly joining the layer functioning as the insulating substrate to the heat sink or firmly joining the layer functioning as the insulating substrate to the intermediate layer and firmly joining the intermediate layer to the heat sink.

The layer functioning as the insulating substrate, the joint members, and the heat sink should preferably have a coefficient of thermal expansion ranging from $3.0 \times 10^{-6}$ to $1.0 \times 10^{-5}$/K. The intermediate layer should preferably have a coefficient of thermal expansion ranging from $3.0 \times 10^{-6}$ to $1.0 \times 10^{-5}$/K in order to lessen stresses produced when the assembly is thermally shocked, and should preferably be made of a material having a low Young's modulus and a low strength so that stresses produced by thermal expansion are small. The intermediate layer may be made of aluminum, silver, copper, or an alloy thereof.

The joint members should preferably be made of a hard brazing material containing an active element. In this case, it is possible to control the thickness of the brazing material by applying the pressure, providing a joined assembly which is better in heat radiation capability than the conventional solder layer having a thickness of several hundreds $\mu$m.

The active element should preferably comprise at least one element belonging to the 2A group, 3A group, 4A group, 5A group, or 4B group in the periodic table.

The heat sink should preferably be made of a material comprising at least one selected from the group consisting of SiC, AlN, $Si_3N_4$, BeO, $Al_2O_3$, $Be_2C$, C, Cu, Cu alloy, Al, Al alloy, Ag, Ag alloy, and Si.

The heat sink should preferably be made of a composite material having an SiC matrix or a C matrix infiltrated with Cu or Cu alloy. The layer functioning as the insulating substrate should preferably comprise an AlN layer or an $Si_3N_4$ layer.

According to the present invention, an electronic component having an electronic circuit chip mounted on a heat sink with a thermally conductive layer and a base layer interposed therebetween is characterized in that the thermally conductive layer includes at least a joint member containing an active element and interposed between a layer functioning as an insulating substrate and the heat sink.

The thermally conductive layer may include at least an intermediate layer interposed between a heat sink and a layer functioning as an insulating substrate, a first joint member containing an active element and interposed between the layer functioning as the insulating substrate and the intermediate layer, and a second joint member containing an active element and interposed between the intermediate layer and the heat sink.

The thermally conductive layer may include an electrode disposed on the layer functioning as the insulating substrate with another joint member interposed therebetween which contains an active element.

BRIEF DESCRIPTION OF DRAWINGS

FIG. 4 is an enlarged view of a C/Cu composite material as another example of the material of a heat sink;

FIG. 5A is a view illustrative of a setting step;

FIG. 5B is a view illustrative of a joining step;

FIG. 6 is a table showing materials of Inventive Examples 1 through 8 and Comparative Examples 1, 2;

FIG. 7 is a table showing experimental results of first and second experiments;

FIG. 8 is a table showing experimental results of a third experiment;

FIG. 10 is a vertical cross-sectional view showing a structure of an electronic component according to a second embodiment of the present invention;

FIG. 12 is a table showing experimental results of the third experiment;

FIG. 14 is a graph showing experimental results of a fourth experiment;

BEST MODE FOR CARRYING OUT THE INVENTION

Embodiments of a member for use in an electronic circuit, a method of manufacturing such a member, and an electronic component according to the present invention will be described below with reference to FIGS. 1 through 14.

Figure 1:
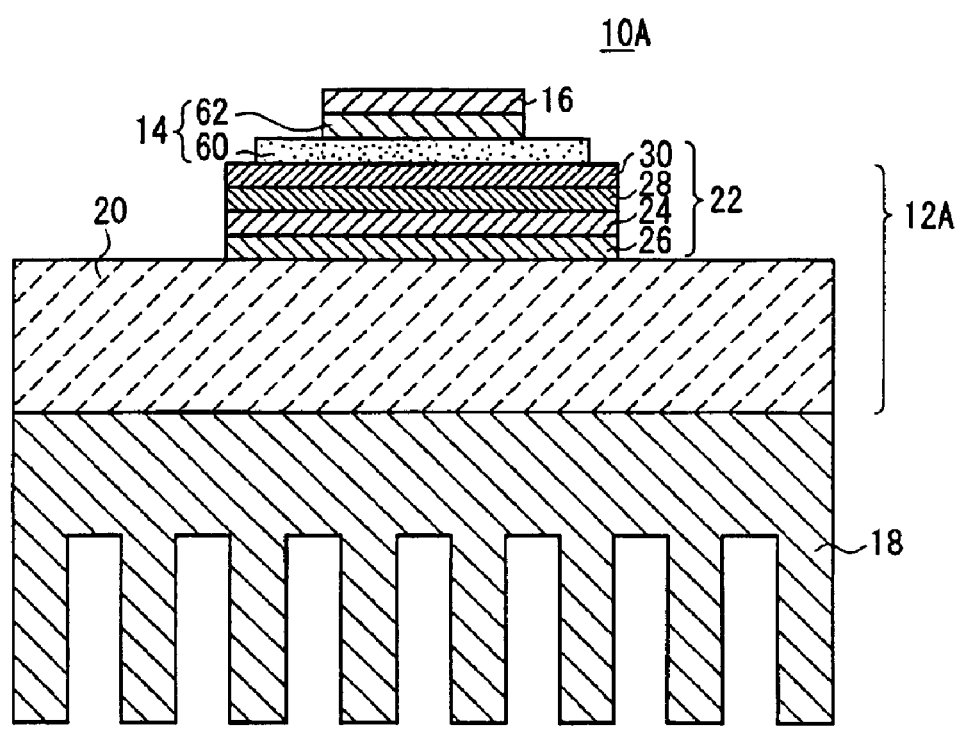
FIG. 1 is a vertical cross-sectional view showing a structure of an electronic component according to an embodiment of the present invention.

As shown in FIG. 1, an electronic component 10A according to a first embodiment has an IC chip 16 mounted on a member 12A for use in an electronic circuit according to the first embodiment with a base layer 14 interposed therebetween, and cooling fins 18 fixed to a lower surface of the member 12A.

Figure 2:
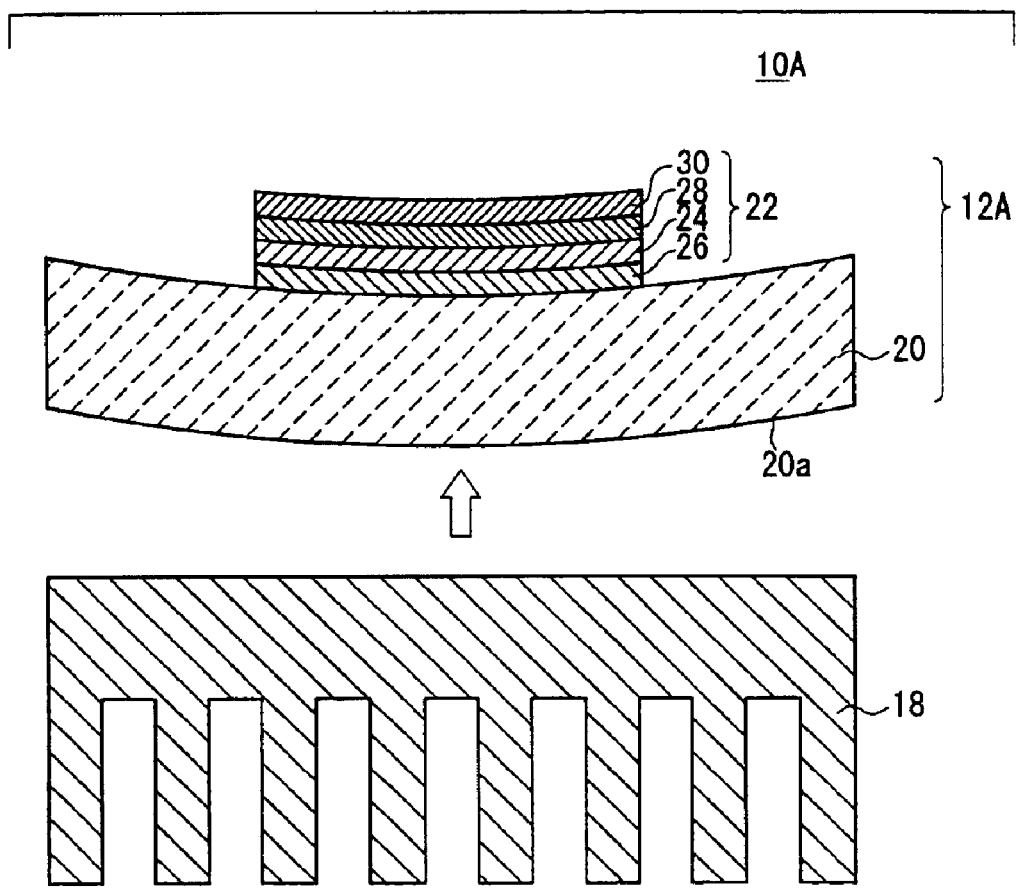
FIG. 2 is a cross-sectional view showing a member for an electronic circuit and cooling fins according to the embodiment.

As shown in FIG. 2, the member 12A has a thermally conductive layer 22 mounted on a heat sink 20.

The thermally conductive layer 22 has a layer functioning as at least an insulating substrate (hereinafter conveniently referred to as "insulating substrate 24") and a first joint member 26 interposed between the insulating substrate 24 and the heat sink 20 and containing an active element.

According to the first embodiment, the thermally conductive layer 22 comprises the first joint member 26, the insulating substrate 24, a second joint member 28 formed on the insulating substrate 24, and an electrode 30 of Cu or Al formed on the second joint member 28.

The insulating substrate 24 may comprise an AlN layer or an $Si_3N_4$ layer. If the insulating substrate 24 comprises an AlN layer, the AlN layer has a coefficient of thermal expansion generally in the range from $3.0 \times 10^{-6}$ to $1.0 \times 10^{-5}$/K though it varies depending on the molar ratio of Al and N. Therefore, the heat sink 20 should preferably have a coefficient of thermal expansion in the range from $3.0 \times 10^{-6}$ to $1.0 \times 10^{-5}$/K. If the coefficient of thermal expansion of the insulating substrate (AlN layer) 24 is $3.0 \times 10^{-6}$/K and the coefficient of thermal expansion of the heat sink 20 exceeds $1.0 \times 10^{-5}$/K, for example, then when the temperature of the electronic component 10A rises due to its usage, the heat sink 20 and the insulating substrate 24 tend to peel off each other.

The molar ratio of Al and N of the insulating substrate 24 should preferably in the range of Al:N=0.8:1.2 to 1.2:0.8. With this molar ratio range, the insulating substrate 24 exhibits, for certain, a coefficient of thermal expansion in the range from $3.0 \times 10^{-6}$ to $1.0 \times 10^{-5}$/K and a coefficient of thermal conductivity which is of 150 W/mK or higher.

The coefficient of thermal conductivity of the heat sink 20 should preferably be of 150 W/mK or higher. If the coefficient of thermal conductivity of the heat sink 20 is lower than 150 W/mK, then it becomes less effective to keep the electronic component 10A at a constant temperature because the rate of transferring, out of the electronic component 10A, the heat generated by the IC chip 16 due to the usage of the electronic component 10A is lowered.

The heat sink 20 may be made of any materials insofar as their coefficient of thermal conductivity and coefficient of thermal expansion are in the above ranges. However, the heat sink 20 should preferably be made of a material comprising at least one selected from the group consisting of SiC, AlN, $Si_3N_4$, BeO, $Al_2O_3$, $Be_2C$, C, Cu, Cu alloy, Al, Al alloy, Ag, Ag alloy, and Si. Specifically, the heat sink 20 may be made of one material selected from the above group or a composite material composed of two or more materials selected from the above group. The composite material may be, for example, an SiC/Cu composite material 20A (see FIG. 3) or a C/Cu composite material 20B (see FIG. 4).

Figure 3:
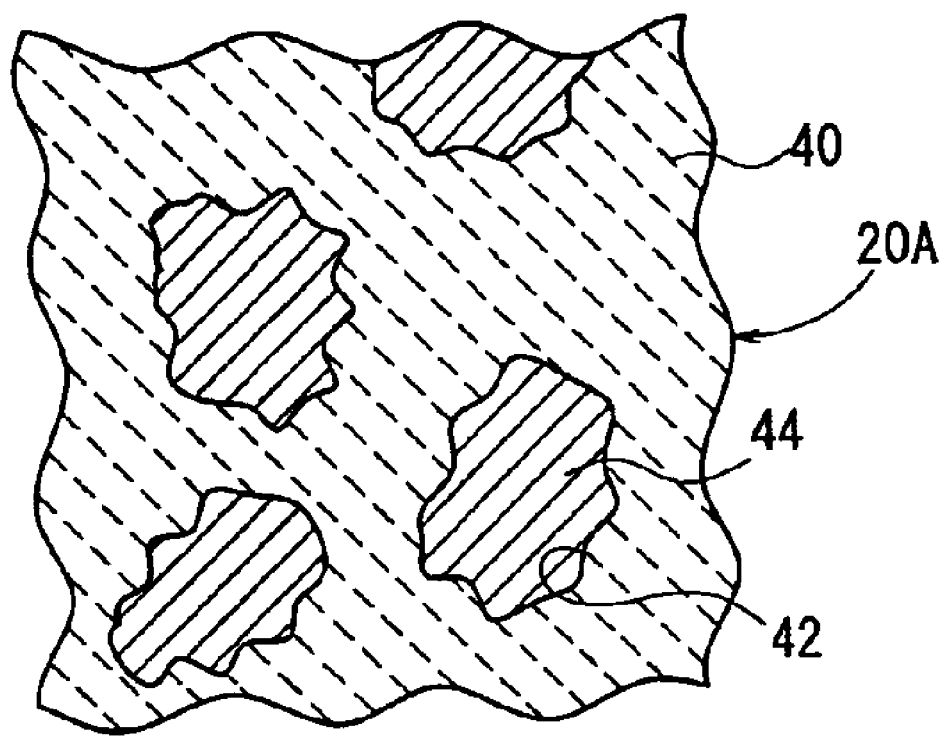
FIG. 3 is an enlarged view of an SiC/Cu composite material as an example of the material of a heat sink.
Figure 9:
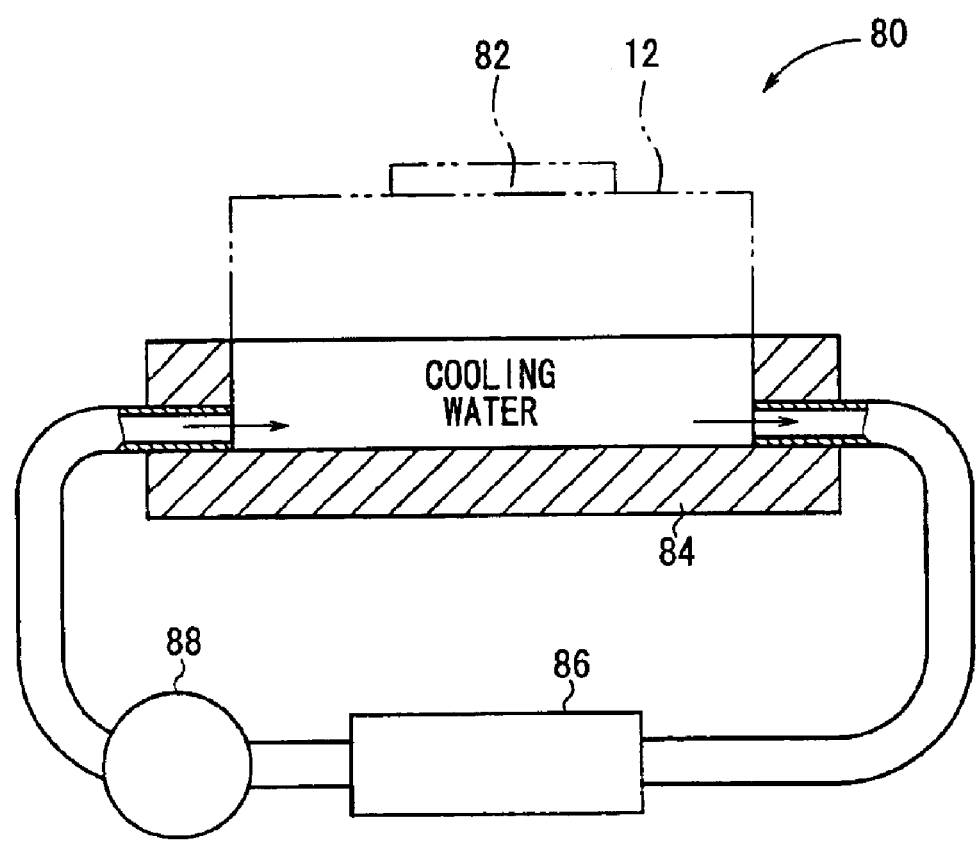
FIG. 9 is a view showing a structure of a thermal resistance measuring device.

As shown in FIG. 3, the SiC/Cu composite material 20A is produced by infiltrating open pores 42 in a porous sintered body 40 of SiC with molten Cu or Cu alloy 44, and then solidifying the Cu or Cu alloy 44.

As shown in FIG. 4, the C/Cu composite material 20B is produced by infiltrating open pores 52 in a porous sintered body 50, which has been produced by preliminarily sintering a body of carbon or an allotrope thereof into a network, with molten Cu or Cu alloy 54, and then solidifying the Cu or Cu alloy 54. For example, the C/Cu composite material 20B may be a material disclosed in Japanese patent application No. 2000-80833.

If the heat sink 20 is made of a composite material or alloy as described above, then its coefficient of thermal conductivity and coefficient of thermal expansion may be controlled at the above ranges (the coefficient of thermal expansion: $3.0 \times 10^{-6}$ to $1.0 \times 10^{-5}$/K, the coefficient of thermal conductivity: 150 W/mK or higher) by setting the composition ratio of the constituents.

The first and second joint members 26, 28 should preferably be made of a hard brazing material containing an active element. The active element may be at least one of elements belonging to the 2A group in the periodic table, e.g., Mg, S, Ca, Ba, Be, etc., elements belonging to the 3A group, e.g., Ce, etc., elements belonging to the 4A group, e.g., Ti, Zr, etc., elements belonging to the 5A group, e.g., Nb, etc., or elements belonging to the 4B group, e.g., B, Si, etc. In the first embodiment, the first and second joint members 26, 28 are made of a hard brazing material of Ag—Cu—Ti or a hard brazing material of Ag—Cu—In—Ti where Ti is an active element.

As shown in FIG. 1, the base layer 14 comprises a solder layer 60 formed on the thermally conductive layer 22 and an Ni layer 62 for increasing the wettability of the IC chip 16 with respect to the solder layer 60.

For using the component 12A, the cooling fins 18 made of Al or Cu, for example, are fastened by screws or the like (not shown) to the lower surface of the heat sink 20. According to the first embodiment, as shown in FIG. 2, the heat sink 20 has an outwardly convex surface (lower surface) 20a on which the cooling fins 18 are mounted.

Specifically, with the thermally conductive layer 22 being formed, the assembly is heated to cause the electrode 30 to shrink thermally, thus warping the heat sink 20 on which the thermally conductive layer 22 to make the lower surface 20a convex outwardly. As a result, a shape of the lower surface 20a becomes an outwardly convex shape. The heat sink 20 should preferably be warped by a dimension which is in a range from 1/200 to 1/20000 of the maximum length of the heat sink 20. If the amount of warpage of the heat sink 20 falls outside the above range, then the cooling fins 18 may not be held in close contact with the heat sink 20 when fastened, causing a heat radiation problem or component damage.

A method of manufacturing the member 12A and the electronic component 10A will be described below with reference to FIGS. 5A and 5B.

In the manufacturing method, the first joint member 26, the insulating substrate 24, the second joint member 28, and the electrode 30 are successively placed (set) in the order named on the heat sink 20 in a setting step shown in FIG. 5A. These members are set in the atmosphere, for example.

In a joining step shown in FIG. 5B, the heat sink 20 on which the first joint member 26, the insulating substrate 24, the second joint member 28, and the electrode 30 are set is fixed to a jig 70, and joined together in a vacuum of 0.00133 Pa or lower under a downwardly applied pressure while the temperature is being increased and lowered. As shown in FIG. 2, the joining process produces a joined assembly of the electrode 30, the insulating substrate 24, and the heat sink 20, i.e., the member 12A.

The applied pressure should preferably be in a range from 0.2 MPa to 10 MPa. The first and second joint members 26, 28 after being joined should have an average thickness of 50 $\mu$m or lower, preferably 10 $\mu$m or lower, or more preferably 5 $\mu$m or lower. This thickness can be controlled by the applied pressure.

As the temperature is increased and lowered in the joining process, the electrode 30 as the uppermost layer shrinks thermally to a greater extent than the other constituent layers because of the different coefficient of thermal expansion. As shown in FIG. 2, therefore, the overall assembly (the thermally conductive layer 22 and the heat sink 20) is warped to make the lower surface 20a of the heat sink 20 convex. The warpage is distinctive if the heat sink 20 is made of the SiC/Cu composite material 20A or the C/Cu composite material 20B. As described above, the dimension which the heat sink 20 is warped is in a range from 1/200 to 1/20000 of the maximum length of the heat sink 20.

If the heat sink 20 is made of pure Cu or Cu alloy, then the lower surface 20a of the heat sink 20 becomes concave. If the lower surface 20a is concave, then because it is difficult to attach the cooling fins 18 shown in FIG. 1 to the concave lower surface 20a, the lower surface 20a needs to be machined (post-machined) to a flat surface, resulting in an increased number of manufacturing steps. Therefore, the heat sink 20 should preferably be made of the SiC/Cu composite material 20A or the C/Cu composite material 20B.

After the member 12A has been manufactured, an ordinary process is carried out. First, a circuit pattern is formed on the surface of the electrode 30. Specifically, a resist for forming a circuit is printed on the entire surface of the electrode 30. After those portions of the resist which are not to be etched are selectively hardened, and unhardened portions of the resist are removed. The exposed copper is then etched away by an aqueous solution of cupric chloride, forming a circuit pattern on the surface of the electrode 30.

Thereafter, in order to remove the brazing material between circuits, the assembly is washed with an aqueous solution of acid ammonium fluoride, and then washed with water several times. Then, the surface of the metal part is plated with Ni—P to provide a protective layer, thus producing a circuit pattern with a protective layer.

Then, the IC chip 16 is joined to the circuit pattern on the electrode 30. In the first embodiment, a commercial silicon IGBT (power semiconductor device) is joined to the electrode 30 by low-temperature solder. Furthermore, though not shown, metal wires are electrically connected to the terminals of the IC chip 16 by wire bonding, and metal wires are similarly connected to the circuit pattern on the electrode 30.

Subsequently, the member 12A with the IC chip 16 joined thereto is placed in a package. A commercial potting silicon gel is poured into the package, and then hardened to increase the electric insulating capability of the member 12A. Then, the assembly is sealed to achieve mechanical reliability, thereby fabricating the electronic component 10A, i.e., a power semiconductor device.

With the member 12A, the method of manufacturing the member 12A, and the electronic component 10A, since the insulating substrate 24 and the heat sink 20 are joined to each other by the first joint member 26 which contains an active element, the active element firmly joins the insulating substrate 24 and the first joint member 26 to each other, and also firmly joins the heat sink 20 and the first joint member 26, resulting in a firm joint between the insulating substrate 24 and the heat sink 20.

Therefore, it is not necessary to interpose an Ni plated layer, a solder layer, an Ni layer, and a lower electrode layer between the heat sink 20 and the insulating substrate 24, but only the first joint member 26 may be interposed between the heat sink 20 and the insulating substrate 24. Consequently, the number of manufacturing steps is greatly reduced, and hence the manufacturing cost is effectively lowered.

According to the first embodiment, the coefficient of thermal expansion of the insulating substrate 24, the first joint member 26, and the heat sink 20 is in the range from $3.0 \times 10^{-6}$ to $1.0 \times 10^{-5}$/K. Therefore, after the IC chip 16 is installed on the member 12A, making up the electronic component 10A, when the temperature of the IC chip 16 is increased due to the usage of the electronic component 10A, the heat sink 20 and the insulating substrate 24 are not peeled off each other. As a result, the electronic component 10A has its reliability increased.

According to the first embodiment, inasmuch as the first joint member 26 is made of a hard brazing material containing an active element, the first joint member 26 has a more excellent heat radiation capability than if it comprises a solder layer. The heat from the IC chip 16 can efficiently be transferred to the heat sink 20, so that the electronic component 10A can easily be designed thermally. Even when the electronic component 10A is subjected to heat cycles and heat shocks, the insulating substrate 24 is less liable to cracking, and hence the thermally reliability of the electronic component 10A is increased.

Specifically, if soldering is used as the case with the conventional semiconductor devices, when the electronic component is subjected to heat cycles or heat shocks, (1) the insulating substrate 24 is warped, (2) the electrodes are peeled off, (3) the insulating substrate 24 cracks, and (4) the soldered areas suffer cracking, resulting in an operation failure of the semiconductor device in the electronic component. According to the present embodiment, the member 12A and the electronic component 10A are free of the above problems and are highly reliable.

Inasmuch as the heat sink 20 is made of the SiC/Cu composite material 20A where the SiC matrix is infiltrated with Cu or-Cu alloy or the C/Cu composite material 20B where the C (Carbon) matrix is infiltrated with Cu or Cu alloy, the heat sink 20 has a low coefficient of thermal expansion and a high coefficient of thermal conductivity, and its coefficient of thermal expansion substantially matches the coefficient of thermal expansion of the insulating substrate 24, with any mismatch greatly reduced. Thus, any residual stresses produced in the insulating substrate 24 when the heat sink 20 is joined thereto are suppressed, so that the heat sink 20 can be joined to the insulating substrate 24 over a large area thereof.

For example, since the C/Cu composite material 20B has an extremely low Young's modulus, which is one of material properties, as disclosed in Japanese patent application No. 2000-80833 referred to above, any residual stresses are not liable to occur after the heat sink 20 is joined to the insulating substrate 24. The insulating substrate 24 is thus resistant to cracks and peel-off.

Furthermore, because the insulating substrate 24 comprises an AlN layer or $Si_3N_4$ layer, the insulating substrate 24 has a coefficient of thermal expansion which is substantially the same as the coefficient of thermal expansion of the IC chip 16 and a high coefficient of thermal conductivity.

Of the surfaces of the heat sink 20, the surface 20a on which the cooling fins 18 are mounted is convex outwardly. Therefore, when the cooling fins 18 are fastened to the heat sink 20 by screws or the like, the heat sink 20 and the cooling fins 18 can easily be secured to each other, and the close contact between the heat sink 20 and the cooling fins 18 can be enhanced for greater heat radiation.

Two experiments (first and second experiments) will be described below with reference to FIGS. 6 through 9. In the first and second experiments, Inventive Examples 1 through 8 and Comparative Examples 1, 2 were experimented, and differences between Inventive Examples 1 through 8 and Comparative Examples 1, 2 are shown in FIG. 6.

In Inventive Example 1, the insulating substrate 24 was an insulating substrate of AlN (aluminum nitride) having a coefficient of thermal conductivity of 180 W/mK, a size of 40×50 mm, and a thickness of 0.635 mm, the electrode 30 was an electrode of Cu (pure copper) having a size of 35×45 mm and a thickness of 0.30 mm, and the heat sink 20 was made of a C/Cu composite material having a size of 50×80 mm and a thickness of 3.0 mm.

The first and second joint members 26, 28, each in the form of a sheet of a commercial brazing material of Ag—Cu—Ti (Ag-35.25 Cu-1.75 Ti) having a thickness of 50 µm, were placed respectively between the insulating substrate 24 and the heat sink 20 and between the electrode 30 and the insulating substrate 24. The assembly was then held in a vacuum of 0.00133 Pa at a given temperature (850° C.) for 10 minutes, and then annealed, producing a joined assembly (the member 12A).

When the temperature was raised and lowered, the member 12A was placed under a pressure of 1 MPa. In the member 12A, brazing layers (the first and second joint members 26, 28), each having a thickness of about 5 µm or less, were finally interposed respectively between the heat sink 20 and the insulating substrate 24 and between the electrode 30 and the insulating substrate 24.

Inventive Example 2 had substantially the same structural details as Inventive Example 1, but differs therefrom in that the first and second joint members 26, 28, each in the form of a sheet of a commercial brazing material of Ag—Cu—In—Ti (Ag-27.25 Cu-12.5 In-1.25 Ti) having a thickness of 50 µm, were placed respectively between the insulating substrate 24 and the heat sink 20 and between the electrode 30 and the insulating substrate 24.

Inventive Examples 3, 4 had substantially the same structural details as Inventive Examples 1, 2, but differ therefrom in that the heat sink 20 was made of the SiC/Cu composite material 20A.

Inventive Examples 5 through 8 had substantially the same structural details as Inventive Examples 1 through 4, but differ therefrom in that the insulating substrate 24 was an insulating substrate of $Si_3N_4$ (silicon nitride) having a coefficient of thermal conductivity of 90 W/mK, a size of 40×50 mm, and a thickness of 0.30 mm.

Comparative Example 1 had substantially the same structural details as the electronic component 200 shown in FIG. 11. The ceramic plate 206 was a copper-lined insulating substrate comprising an insulating substrate of AlN (aluminum nitride) having a coefficient of thermal conductivity of 180 W/mK, a size of 40×50 mm, and a thickness of 0.635 mm, with the upper electrode 210 and the lower electrode 214, each made of Cu and having a size of 35×45 mm and a thickness of 0.30 mm, joined to the respective opposite surfaces of the insulating substrate. The heat sink (metal base plate) 202 comprised a heat sink of Cu having a size of 50×80 mm and a thickness of 3.0 mm. The circuit pattern of the upper electrode 210 was plated with Ni—P for surface protection. The copper-lined insulating substrate with the surface protection was soldered to the heat sink 202, providing a joined assembly (a member for use in an electronic circuit).

Comparative Example 2 had substantially the same structural details as the present embodiment. Specifically, the insulating substrate 24 was an insulating substrate of AlN (aluminum nitride) having a coefficient of thermal conductivity of 180 W/mK, a size of 40×50 mm, and a thickness of 0.635 mm, the electrode 30 was an electrode of Cu (pure copper) having a size of 35×45 mm and a thickness of 0.30 mm, and the heat sink 20 was made of Cu and had a size of 50×80 mm and a thickness of 3.0 mm.

The first and second joint members 26, 28, each in the form of a sheet of a commercial brazing material of Ag—Cu—In—Ti (Ag-27.25 Cu-12.5 In-1.25 Ti) having a thickness of 50 µm, were placed respectively between the insulating substrate 24 and the heat sink 20 and between the electrode 30 and the insulating substrate 24. The assembly was then held in a vacuum of 0.00133 Pa at 730° C. for 10 minutes, and then annealed, producing a joined assembly (the member 12A). When the temperature was raised and lowered, the member 12A was placed under a pressure of 1 MPa.

In the first experiment, Inventive Examples 1 through 8 and Comparative Examples 1, 2 were checked for their thermal resistances. First, a thermal resistance measuring device 80 shown in FIG. 9 was produced. The thermal resistance measuring device 80 has a heater 82 soldered to the upper surface of the member 12A, or precisely the upper surface of the electrode 30, and a cooling device 84 mounted on the lower surface of the member 12A, or precisely the lower surface 20a of the heat sink 20, for circulating cooling water. To the cooling device 84, there are connected a water bath 86 with a pump and a flow meter 88.

The heater 82 was energized with 10 W, and the cooling device 84 circulates water at a temperature of 24° C. at a rate of 2 liters/minute. The temperature of the heater surface and the temperature of the interface between the heat sink 20 and the cooling water were measured, and thermal resistances of Inventive Examples 1 through 8 and Comparative Examples 1, 2 were calculated. The thermal resistances were evaluated relatively to the thermal resistance of Comparative Example 1 which was regarded as "1".

The experimental results of the first experiment are shown in FIG. 7. FIG. 7 indicates that the thermal resistances of Inventive Examples 1 through 6 are less than 1 and lower than that of Comparative Example 1. It reveals that the temperature difference between the heater surface and the interface (the interface between the heat sink 20 and the cooling water) is small, and Inventive Examples 1 through 6 provide a better cooling effect than Comparative Example 1.

The thermal resistances of Inventive Examples 7, 8 are substantially of the same as the thermal resistance of Comparative Example 1. However, Inventive Examples 7, 8 are able to provide a heat-radiating laminated assembly having a better cooling effect than Comparative Example 1 as a general because of better thermal shock resistance.

In the second experiment, Inventive Examples 11 through 13 and Comparative Examples 1, 2 were checked for the state of being warped of the member 12A, i.e., for how the surface of the member 12A on which the cooling fins 18 are to be mounted are warped outwardly.

Inventive Examples 11 through 13 had substantially the same structural details as Inventive Example 2. Inventive Example 11 had exactly the same structural details as Inventive Example 2. Inventive Example 12 differs from Inventive Example 2 in that the heat sink 20 had a coefficient of thermal expansion of 6.2 ppm/K, and Inventive Example 13 differs from Inventive Example 2 in that the heat sink 20 had a coefficient of thermal expansion of 8.4 ppm/K.

The experimental results of the second experiment are shown in FIG. 8. In FIG. 8, the amount of warpage represents a dimension with respect to the maximum length of the heat sink 20 which was 100 mm.

It can be seen from the experimental results that Comparative Example 1 had substantially no warpage, Comparative Example 2 was warped concavely, and Inventive Examples 11 through 13 were warped convexly, i.e., had a preferred configuration. The coefficient of thermal expansion of the heat sink 20 may be controlled to give a heat-radiating laminated assembly a desired amount of warpage.

An electronic component 10B according to a second embodiment of the present invention will be described below with reference to FIGS. 10 through 14.

As shown in FIG. 10, the electronic component 10B according to the second embodiment has substantially the same structural details as the electronic component 10A, but has a component 12B for use in an electronic circuit which is partly different from that of the electronic component 10A. Specifically, the thermally conductive layer 22 includes an intermediate layer 90 interposed between the insulating substrate 24 and the heat sink 20, a third joint member 92 interposed between the insulating substrate 24 and the intermediate layer 90 and containing an active element, and a fourth joint member 94 interposed between the intermediate layer 90 and the heat sink 20 and containing an active element. In the embodiment shown in FIG. 10, a metal layer 96 is formed on the lower surface of the heat sink 20.

The dimensions of the electrode 30, particularly the minimum thickness thereof, are determined by the density of a current flowing therethrough. The maximum thickness of the electrode 30 is determined by the thermal shock resistance after the electrode 30 has been joined, or the control target for the overall amount of warpage of the electronic component 10B. A preferable range of the maximum thickness of the electrode 30 is 0.1 to 1.0 mm. In this embodiment, the maximum thickness of the electrode 30 is 0.3 mm. If the insulating substrate 24 is made of AlN, then the maximum thickness of the electrode 30 may be 0.5 mm.

Of the dimensions of the insulating substrate 24, the minimum thickness is selected to keep insulation against the current flowing through the electrode 30. However, since the insulating substrate 24 is the most fragile in the entire electronic component 10B, the minimum thickness thereof is practically selected in view of mechanical strength, i.e., to make the insulating substrate 24 resistant against thermal shocks.

The maximum thickness of the insulating substrate 24 is determined by the value of the thermal resistance (the thicker the insulating substrate 24, the poorer the thermal resistance). Though a larger thickness gives a greater mechanical strength, it possibly lowers the thermal conduction in the circuit. The thickness of the insulating substrate 24 should preferably be in the range from 0.1 to 1.0 mm. If the insulating substrate 24 is made of AlN, then the maximum thickness thereof should preferably be of about 0.635 mm.

The intermediate layer 90 serves to lessen the difference between the thermal expansion of the insulating substrate 24 and the thermal expansion of the heat sink 20 when the electronic component was thermally shocked, improve the bonding strength and thermal shock resistance of the electronic component 10B as a whole.

The intermediate layer 90 should have a preferable thickness ranging from 0.05 to 1.0 mm. If the intermediate layer 90 were to reduce stresses only, then it may be thin to provide the desired effect (reduce stresses). However, if the volume of the intermediate layer 90 is substantially the same as the volume of the electrode 30, then the intermediate layer 90 makes the thermally conductive layer 22 well balanced between those above the insulating substrate 24 and those below the insulating substrate 24.

The intermediate layer 90 may be made of copper, silver, aluminum, or an alloy thereof which is highly thermally conductive. If the ability of aluminum to reduce stresses is expressed by 1, then the ability of copper to reduce stresses by 7 to 8, and the ability of silver to reduce stresses by 5 to 6. It is thus preferable to determine the thickness of the intermediate layer 90 in view of the ratio of these values.

Aluminum has a coefficient of thermal conductivity of 230 W/mK, copper 390 W/mK, and silver 415 W/mK. Of these material, silver has the best coefficient of thermal conductivity. These materials should preferably be selected in terms of a balance between the manufacturing cost and the temperatures of the joint members 92, 94. In the second embodiment, aluminum and copper are selected as materials of the intermediate layer 90.

The intermediate layer 90 also serves to increase thermal radiation as well as to reduce stresses that are produced due to different thermal expansions.

The heat sink 20 has a mechanical strength large enough to fix itself to the cooling fins 18, and has dimensions determined by the conductivity of the heat generated by the IC chip 16 on the electrode 30. Usually, the heat sink 20 has a thickness of about 3 mm. Since the heat sink 20 may be directly cooled by water or may have a fin-like shape itself so as to be cooled by air, the heat sink 20 should preferably have a thickness ranging from 1 to 30 mm.

The metal layer 96 formed on the lower surface of the heat sink 20 should preferably be made of a material which is selected based on its affinity for the cooling fins 18 that are fixed to the heat sink 20. If the heat sink 20 is directly cooled by water or has a fin-like shape itself so as to be cooled by air, then the metal layer 96 may have a thickness and a shape which are suitable for such a heat sink design.

The third and fourth joint members 92, 94 are identical to the first and second joint members 26, 28 of the electronic component 10A described above, and will not be described below.

A method of manufacturing the member 12B and the electronic component 10B will be described below with reference to FIGS. 11A and 11B.

Figure 11A:
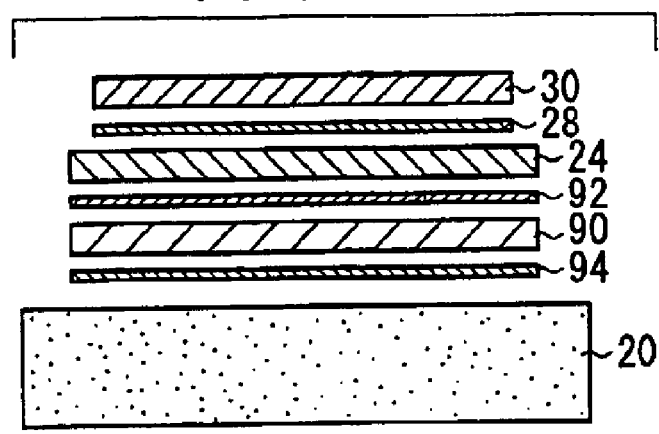
FIG. 11A is a view illustrative of a setting step.

In the manufacturing method according to the second embodiment, the fourth joint member 94, the intermediate layer 90, the third joint member 92, the insulating substrate 24, the second joint member 28, and the electrode 30 are successively placed (set) in the order named on the heat sink 20 in a setting step shown in FIG. 11A. These members are set in the atmosphere, for example.

Figure 11B:
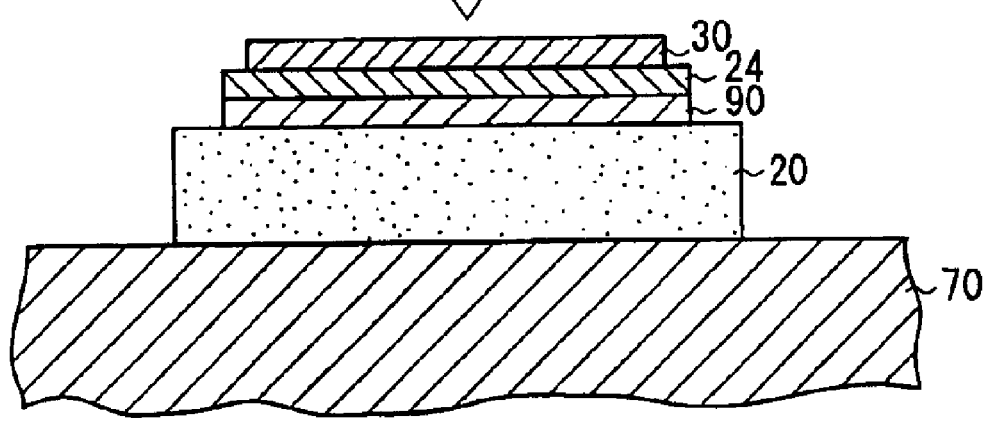
FIG. 11B is a view illustrative of a joining step.

In a joining step shown in FIG. 11B, the heat sink 20 on which the fourth joint member 94, the intermediate layer 90, the third joint member 92, the insulating substrate 24, the second joint member 28, and the electrode 30 are set is fixed to a jig 70, and joined together in a vacuum of 0.00133 Pa or lower under a downwardly applied pressure while the temperature is being increased and lowered. As shown in FIG. 10, the joining process produces a joined assembly of the electrode 30, the insulating substrate 24, and the heat sink 20, i.e., the member 12B.

The applied pressure should preferably be in a range from 0.2 MPa to 10 MPa. The third and fourth joint members 92, 94 after being joined should have an average thickness of 50 µm or lower, preferably 10 µm or lower, or more preferably 5 µm or lower. This thickness can be controlled by the applied pressure.

The subsequent processing details of the manufacturing method are the same as those of the method of manufacturing the member 12A and the electronic component 10A, and will not be described below.

With the member 12B, the method of manufacturing the member 12B, and the electronic component 10B, since the third joint member 92 containing an active element is interposed between the insulating substrate 24 and the intermediate layer 90, and the fourth joint member 94 containing an active element is interposed between the intermediate layer 90 and the heat sink 20, the active metal contained in the third and fourth joint members 92, 94 firmly joins the insulating substrate 24 and the intermediate-layer 90 to each other, and also firmly joins the intermediate layer 90 and the heat sink 20 to each other.

The presence of the intermediate layer 90 serves to lessen the difference between the thermal expansion of the insulating substrate 24 and the thermal expansion of the heat sink 20 when the assembly was thermally shocked, and improve the bonding strength of the member 12B. Thus, the intermediate layer 90 is effective to increase the thermal shock resistance of the member 12B.

Three experiments (conveniently referred to as third through fifth experiments) are shown below. In the third experiment, it was checked how the coefficient of thermal conductivity is increased by interposing the intermediate layer 90 in Inventive Examples 21 through 25, as shown in FIGS. 12 and 13.

In Inventive Example 21, the insulating substrate 24 was made of AlN having a coefficient of thermal conductivity of 180 W/mK. In Inventive Examples 22 through 25, the respective insulating substrates 24 were made of $Si_3N_4$ having respective coefficients of thermal conductivity of 30, 40, 60, and 90 W/mK. The experimental results are shown in FIGS. 12 and 13. In these Examples, the intermediate layer 90 was made of Cu having a coefficient of thermal conductivity of 390 W/mK. In FIG. 12, $Si_3N_4$ which the insulating substrate 24 was made of is simply referred to as "SN".

Figure 13:
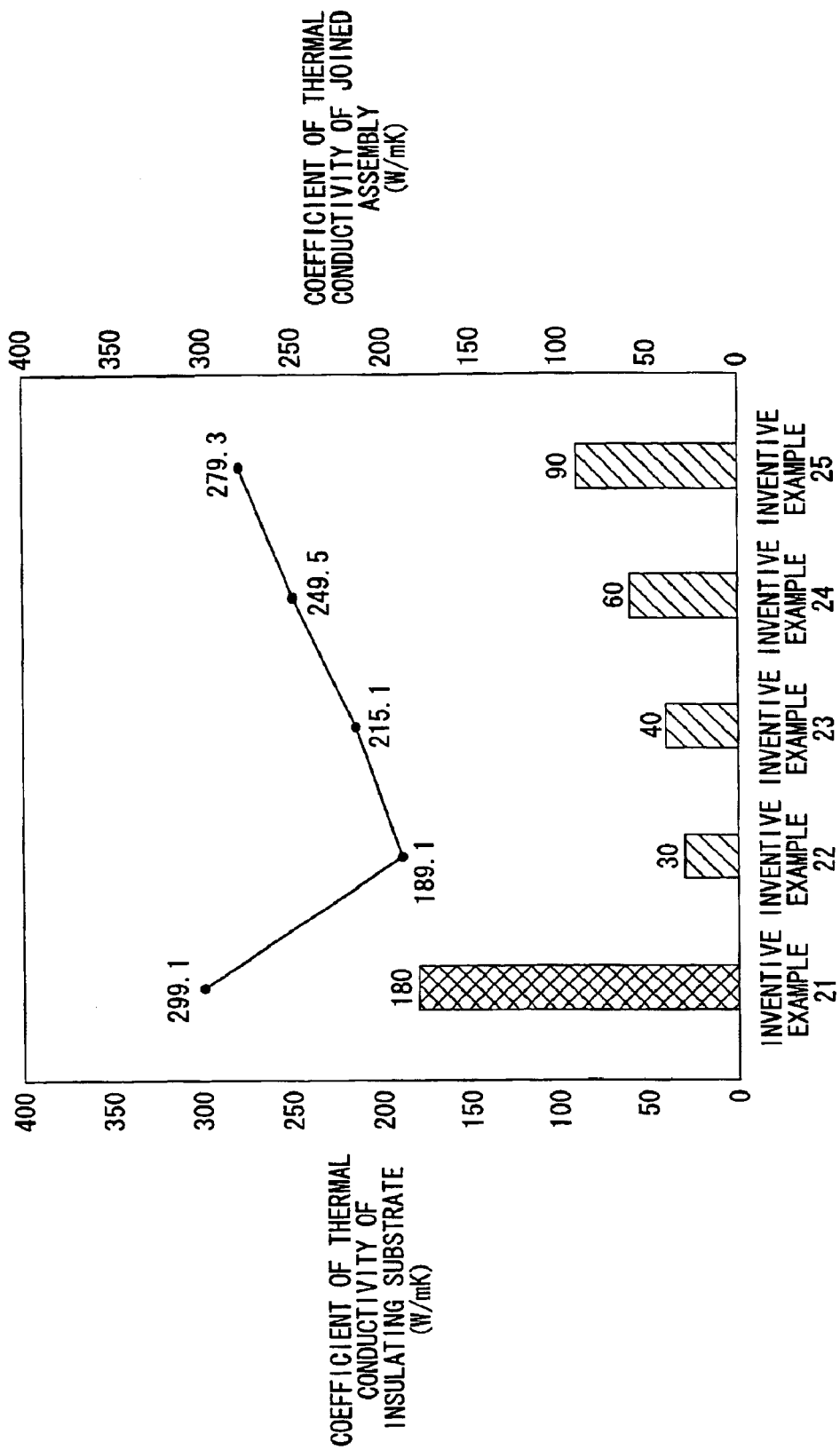
FIG. 13 is a graph showing experimental results of the third experiment.
Figure 15:
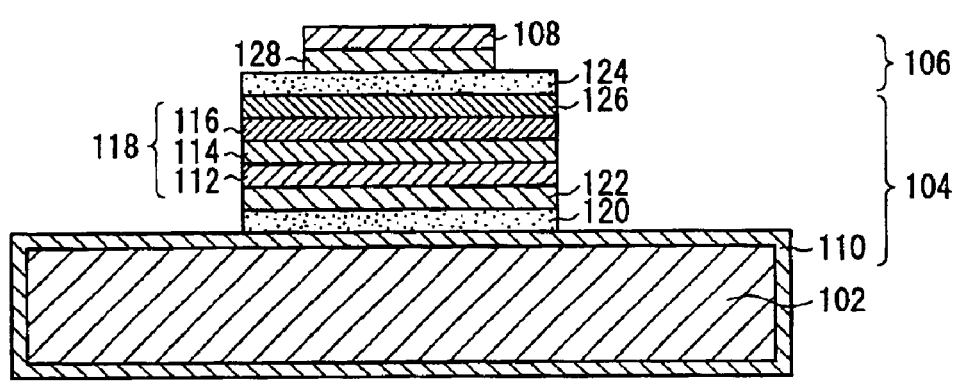
FIG. 15 is a vertical cross-sectional view showing a conventional electronic component.
Figure 16:
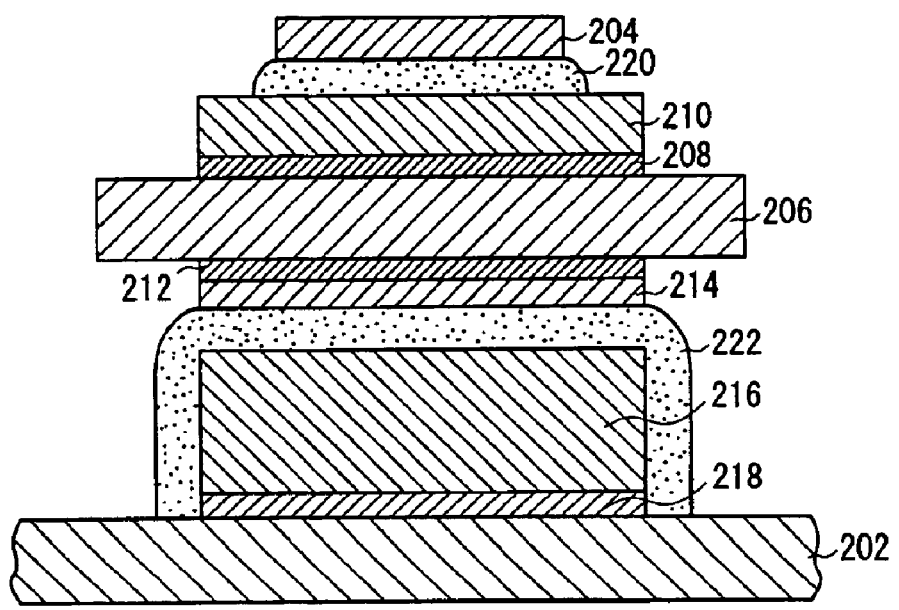
FIG. 16 is a vertical cross-sectional view showing another conventional electronic component.

In FIG. 13, the bar graph represents the coefficient of thermal conductivity of the insulating substrate 24, and the polygonal graph the theoretical coefficient of thermal conductivity of the joined assembly (the member 12B).

It can be understood from FIGS. 12 and 13 that the coefficient of thermal conductivity of the joined assembly is greatly increased by interposing the intermediate layer 90. Particularly, Inventive Examples 22 through 25 show an increase, by 3 to 6 times, in the coefficient of thermal conductivity of the insulating substrate 24.

In the fourth experiment, the amount of warpage of the joined assembly (the member for use in an electronic circuit) was measured when the intermediate layer 90 was interposed and not interposed, and under the pressure applied when the constituent members were joined. The experiment results are shown in FIG. 14.

It can be seen from FIG. 14 that the amount of warpage is smaller when the intermediate layer 90 is present, the amount of warpage is smaller when the applied pressure is lower, and the amount of warpage is smaller when the intermediate layer 90 is thinner.

If the intermediate layer 90 comprises a metal layer, then as the thickness of the intermediate layer 90 increases, the thermal conductivity of the electronic component 10B as a whole increases. However, since the overall amount of warpage is smaller as the thickness of the intermediate layer 90 is smaller, the dimensions of the intermediate layer 90 should preferably be determined in view of these considerations.

In the fifth experiment, Inventive Examples 51 through 53 were tested for thermal shock resistance. In Inventive Example 51, the insulating substrate 24 was made of $Si_3N_4$, and the intermediate layer 90 was interposed. In Inventive Example 52, the insulating substrate 24 was made of AlN, and the intermediate layer 90 was interposed. In Inventive Example 53, the insulating substrate 24 was made of $Si_3N_4$, and the intermediate layer 90 was not interposed.

The thermal shock resistance test was conducted using a thermal shock resistance tester (TSA-71S manufactured by Tabai Espec Corp.). The thermal shock resistance tester is divided into a specimen placement area, a high-temperature area, and a low-temperature area. The thermal shock resistance tester has a structure capable of instantly changing the temperature in a specimen chamber into a low temperature, a normal temperature, and a high temperature by opening and closing a damper (functioning as a temperature shutter) communicating with the specimen chamber to introduce ambient air into the specimen chamber.

The test was conducted by holding the temperature in the specimen chamber at the room temperature for 5 minutes, then lowering the temperature to −65° C., holding the temperature of −65° C. for 15 minutes, increasing the temperature up to the room temperature, holding the room temperature for 5 minutes, increasing the temperature up to 150° C., holding the temperature of 150° C. for 15 minutes, and lowering the temperature to the room temperature. The above temperature control sequence was carried out as one cycle.

Five specimens were prepared for each of the Examples. The thermal shock resistance of each Example was evaluated in terms of the number of cycles when the insulating substrate of even one specimen cracked or the joint of the heat radiating plate was peeled off.

Cracks in the insulating substrate 24 after the thermal shock resistance test were evaluated using an ultrasonic inspection tester (AT7500 manufactured by Hitachi, Ltd.).

As a result of the fifth experiment, the thermal shock resistance of Inventive Example 51 was represented by 1000 cycles or more, the thermal shock resistance of Inventive Example 52 by 200 cycles or less, and the thermal shock resistance of Inventive Example 53 by about 500 cycles.

It can be understood that the thermal shock resistance is increased by making the insulating substrate 24 of $Si_3N_4$ and interposing the intermediate layer 90.

The member for use in an electronic circuit, the method of manufacturing the member, and the electronic component according to the present invention are not limited to the above embodiments, but may be arranged in various manners without departing from the scope of the present invention.

What is claimed is:

1. A member for use in an electronic circuit characterized in that an intermediate layer is interposed between a layer functioning as an insulating substrate and a heat sink, and joint members each containing an active element are interposed respectively between said layer functioning as the insulating substrate and said intermediate layer and between said intermediate layer and said heat sink, wherein one of said joint members directly contacts said heat sink, and the entireties of said heat sink and said one of said joint members directly contacting said heat sink are at least as wide as said insulating substrate.

2. A member for use in an electronic circuit according to claim 1, characterized in that said layer functioning as the insulating substrate, said joint members, and said heat sink have a coefficient of thermal expansion ranging from $3.0 \times 10^{-6}$ to $1.0 \times 10^{-5}$/K.

3. A member for use in an electronic circuit according to claim 1, characterized in that said joint members are made of a hard brazing material containing an active element.

4. A member for use in an electronic circuit according to claim 1, characterized in that said active element comprises at least one element belonging to the 2A group, 3A group, 4A group, 5A group, or 4B group in the periodic table.

5. A member for use in an electronic circuit according to claim 1, characterized in that said heat sink is made of a material comprising at least one selected from the group consisting of SiC, AlN, $Si_3N_4$, BeO, $Al_2O_3$, $Be_2C$, C, Cu, Cu alloy, Al, Al alloy, Ag, Ag alloy, and Si.

6. A member for use in an electronic circuit according to claim 5, characterized in that said heat sink is made of a composite material having an SiC matrix infiltrated with Cu or Cu alloy.

7. A member for use in an electronic circuit according to claim 5, characterized in that said heat sink is made of a composite material having a C matrix infiltrated with Cu or Cu alloy.

8. A member for use in an electronic circuit according to claim 1, characterized in that said layer functioning as the insulating substrate comprises an AlN layer or an $Si_3N_4$ layer.

9. A member for use in an electronic circuit according to claim 1, characterized in that said heat sink has an outwardly convex surface on which cooling fins are mounted.

10. A member for use in an electronic circuit according to claim 9, characterized in that said outwardly convex surface of said heat sink projects by a dimension which is in a range from $1/200$ to $1/20000$ of the maximum length of said heat sink.

11. A method of manufacturing a member for use in an electronic circuit, characterized by the steps of interposing an intermediate layer between a heat sink and a layer functioning as an insulating substrate, interposing a first joint member containing an active element between said layer functioning as the insulating substrate and said intermediate layer, interposing a second joint member containing an active element between said intermediate layer and said heat sink, and joining the layers and the joint members, wherein said second joint member directly contacts said heat sink, and the entireties of said heat sink and said second joint member are at least as wide as said insulating substrate.

12. A method of manufacturing a member for use in an electronic circuit according to claim 11, characterized in that the layer and the joint members are joined under pressure.

13. A method of manufacturing a member for use in an electronic circuit according to claim 12, characterized in that said pressure ranges from 0.2 MPa to 10 MPa.

14. A method of manufacturing a member for use in an electronic circuit according to claim 11, characterized in that said layer functioning as the insulating substrate, said joint members, and said heat sink have a coefficient of thermal expansion ranging from $3.0 \times 10^{-6}$ to $1.0 \times 10^{-5}$/K.

15. A method of manufacturing a member for use in an electronic circuit according to claim 11, characterized in that said joint members are made of a hard brazing material containing an active element.

16. A method of manufacturing a member for use in an electronic circuit according to claim 15, characterized in that said active element comprises at least one element belonging to the 2A group, 3A group, 4A group, 5A group, or 4B group in the periodic table.

17. A method of manufacturing a member for use in an electronic circuit according to claim 11, characterized in that said heat sink is made of a material comprising at least one selected from the group consisting of SiC, AlN, $Si_3N_4$, BeO, $Al_2O_3$, $Be_2C$, C, Cu, Cu alloy, Al, Al alloy, Ag, Ag alloy, and Si.

18. A method of manufacturing a member for use in an electronic circuit according to claim 17, characterized in that said heat sink is made of a composite material having an SiC matrix infiltrated with Cu or Cu alloy.

19. A method of manufacturing a member for use in an electronic circuit according to claim 17, characterized in that said heat sink is made of a composite material having a C matrix infiltrated with Cu or Cu alloy.

20. A method of manufacturing a member for use in an electronic circuit according to claim 11, characterized in that said layer functioning as the insulating substrate comprises an AlN layer or an $Si_3N_4$ layer.

21. An electronic component having an electronic circuit chip mounted on a heat sink with a thermally conductive layer and a base layer interposed therebetween, characterized in that said thermally conductive layer includes at least an intermediate layer interposed between said heat sink and a layer functioning as an insulating substrate, a first joint member containing an active element interposed between said layer functioning as the insulating substrate and said intermediate layer, and a second joint member containing an active element interposed between said intermediate layer and said heat sink, wherein said second joint member directly contacts said heat sink, and the entireties of said heat sink and said second joint member are at least as wide as said insulating substrate.

22. An electronic component according to claim 21, characterized in that said thermally conductive layer includes an electrode disposed on said layer functioning as the insulating substrate with a third joint member interposed therebetween which contains an active element.

23. A method of manufacturing a member for use in an electronic circuit according to claim 11, characterized in that said heat sink, said layer functioning as an insulating substrate, and an electrode are simultaneously joined.

* * * * *